US008304868B2

(12) United States Patent
Amaro et al.

(10) Patent No.: US 8,304,868 B2
(45) Date of Patent: Nov. 6, 2012

(54) MULTI-COMPONENT ELECTRONIC SYSTEM HAVING LEADFRAME WITH SUPPORT-FREE WITH CANTILEVER LEADS

(75) Inventors: Michael G Amaro, Naperville, IL (US); Steven A Kummerl, Carrollton, TX (US); Taylor R Efland, Richardson, TX (US); Sreenivasan K Koduri, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 95 days.

(21) Appl. No.: 12/902,271

(22) Filed: Oct. 12, 2010

(65) Prior Publication Data

US 2012/0086112 A1    Apr. 12, 2012

(51) Int. Cl.
*H01L 23/495* (2006.01)
(52) U.S. Cl. ............... 257/674; 257/676; 257/E23.031; 438/111; 438/123
(58) Field of Classification Search .......... 257/666–677, 257/E23.031–E23.059, 723; 438/111, 112, 438/123, FOR. 368, FOR. 367, FOR. 377, 438/FOR. 380
See application file for complete search history.

(56) References Cited

U.S. PATENT DOCUMENTS

| 6,972,484 | B2 | 12/2005 | Efland |
| 7,060,607 | B2 | 6/2006 | Efland |
| 7,135,759 | B2 | 11/2006 | Efland et al. |
| 7,514,292 | B2 | 4/2009 | Efland et al. |
| 2006/0231931 | A1 | 10/2006 | Kang et al. |
| 2008/0157299 | A1 | 7/2008 | Holloway et al. |
| 2010/0219519 | A1* | 9/2010 | Owyang et al. ............... 257/676 |

FOREIGN PATENT DOCUMENTS

| JP | 2006086229 A | 7/2006 |
| WO | 2008054929 A2 | 5/2008 |

* cited by examiner

*Primary Examiner* — Jasmine Clark
(74) *Attorney, Agent, or Firm* — Steven A. Shaw; W. James Brady; Frederick J. Telecky, Jr.

(57) ABSTRACT

A pallet (501) supporting a half-etched leadframe with cantilever-type leads (403) without metallic supports during the step of attaching components (510) to the leads in order to assemble an electronic system. After assembly, the pallet is removed before the molding step that encapsulates (601*a*) the components on the leadframe and mechanically supports (601*b*) the cantilever leads. The pallet is machined from metal or inert plastic material, tolerates elevated temperatures during soldering, and is reusable for the next assembly batch.

9 Claims, 3 Drawing Sheets

MULTI-COMPONENT ELECTRONIC SYSTEM HAVING LEADFRAME WITH SUPPORT-FREE WITH CANTILEVER LEADS

FIELD OF THE INVENTION

The present invention is related in general to the field of semiconductor devices and processes, and more specifically to structure and fabrication method of a multi-component electronic system having a leadframe with support-free cantilever leads.

DESCRIPTION OF RELATED ART

Electronic products in commercial applications of fields such as telecom, home audio, and regulator products often need systems, which can switch power supplies, regulate and stabilize voltages, and work as dc-dc converters. In order to operate properly, these systems not only need to have high efficiency, but should preferably also have small dimensions and very low cost. As an example of a system, popular power switches involve a metal leadframe, on which a plurality of discrete electronic components are assembled and then, as a unit, wrapped into a plastic encapsulation. The components may include a wire-bonded and packaged MOS Field Effect Transistor (FET) with low resistance and for large current handling; a packaged inductor; and an assortment of resistors and capacitors.

When a metal leadframe is used to assemble these components, it is practical to first etch these leadframes partially so that the thinner portions can function as elongated cantilever-like leads to serve as assembly places for the electronic components, while a plurality of spots are allowed to remain un-etched as thicker portions to become soldering pads exposed from the final encapsulation. The assembly is in most cases an attachment step by soldering and thus involves some mechanical pressure. Consequently, the step of assembling and soldering the components on the thin leads requires physical support and stabilization of the leads. This requirement is conventionally achieved by additional supporting features such as bumps and pads, which are also left un-etched in strategic locations of the leads during the step of half-etching the leads. In the process step of encapsulating the system, these bumps and pads remain exposed from the final encapsulation. In the most popular encapsulation method, the assembled leadframes are packaged by a molding technique in an epoxy-based polymeric compound, which thus leaves the soldering pads as well as the support bumps exposed.

SUMMARY OF THE INVENTION

Applicants investigated a large number of electronic molded systems such as power switches, voltage regulators, etc., which had received complaints from customers for exhibiting a high risk of developing electrical shorts during solder attachment to boards, further a tendency of delaminating the molding compound from the metal leadframe with subsequent sensitivity to moisture ingress and even metal corrosion, and a general interference with existing board designs. Applicants identified as the root cause for the overwhelming majority of complaints the involvement and failure of the metal pads and bumps, which are exposed from the underside of the package not for an electrical function, but as leftovers from their auxiliary function of physically supporting the thin cantilever leads during the assembly step of soldering the components to the half-etched leads.

Applicants discovered that the problem of assembling and encapsulating a leadframe-based package having relatively long cantilever-type leads without metallic supports (that would be exposed from the encapsulation) can be solved by using a pallet that supports the half-etched leadframe during the step of attaching the components. After attachment (for instance by soldering), the components form bridges between the leads and thus lend stability and robustness to the cantilever leads. As a consequence, the leadframe support by the pallet needs to be only temporary; the pallet can be removed before the molding step that is encapsulating the components on the leadframe and thereby packaging the device. The pallet is reusable for the next assembly batch.

It is a technical advantage of the invention that the pallet may be made of an inexpensive metal or other inert material, which tolerates the temperatures for assembling the components on the leadframe. It is another technical advantage that the pallet can be manufactured according to any leadframe design, without specific attention to precision and in rapid turn-around time.

BRIEF DESCRIPTION OF THE DRAWINGS

FIG. 1 depicts the package material encapsulating the system as transparent.

DETAILED DESCRIPTION OF THE PREFERRED EMBODIMENTS

Figure 1:
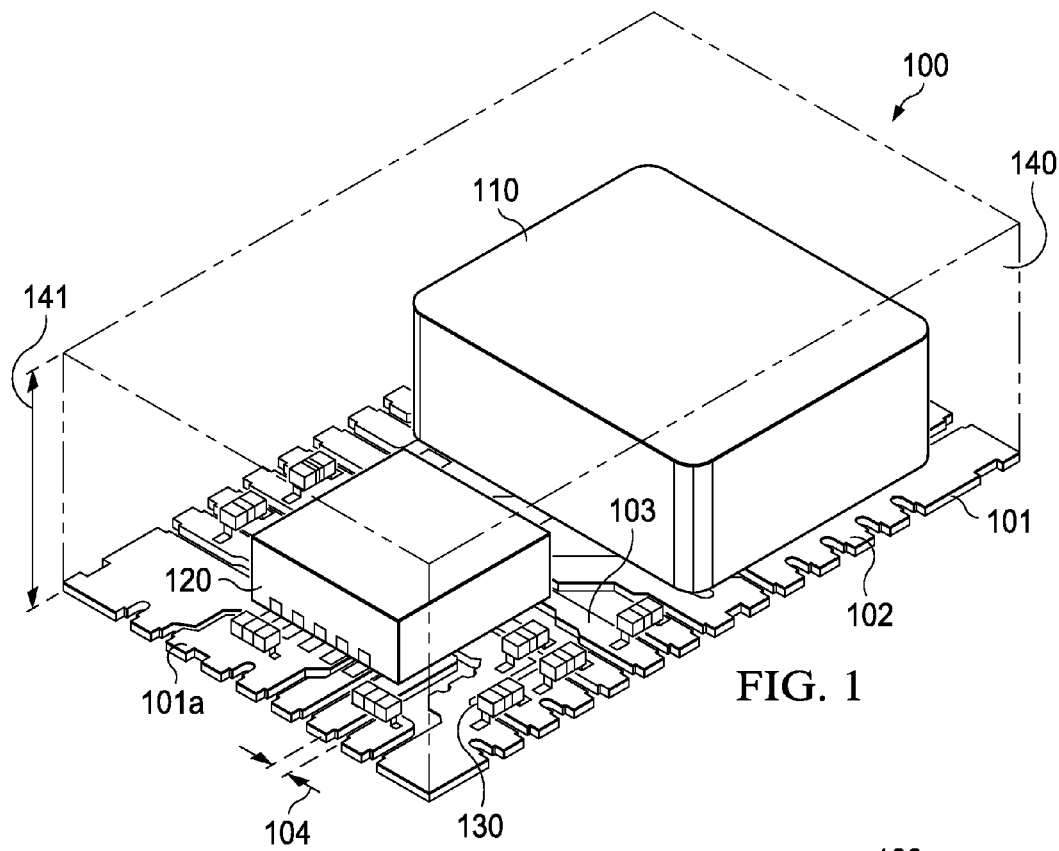
FIG. 1 illustrates a perspective top view of a packaged electronic system according to the invention, wherein the system has a QFN/SON-type leadframe with elongated leads. For clarity purpose.

FIG. 1 displays a top view of an exemplary packaged electronic system generally designated 100. The system is based on a QFN/SON-type metal leadframe 101, preferably made of copper or a copper alloy. The leadframe has, like generally in Quad Flat No-Lead (QFN) and Small Outline No-Lead (SON) devices, no metallic leads shaped as cantilevers protruding from the device package; rather, the metallic contacts for electrical connection and for board attach (by pressure or soldering) are provided by flat metal pads. As FIG. 1 indicates, the lead ends 102, shaped as flat pads, are arrayed along the periphery of leadframe 101. The lead ends 102 belong to metal leads 103, which are elongated and extend from the periphery towards the center region of the leadframe. Adjacent elongated leads 103 are spaced by gaps 104. More details of the structure, organization, and thicknesses of the leads 103 of leadframe 101 are discussed in FIG. 4.

As FIG. 1 further shows, system 100 includes a plurality of electronic components assembled on the leadframe surface 101a facing the inside of system 100. The components include an inductor 110 encapsulated in its own housing, a packaged power integrated circuit 120 (frequently a wire bonded IC), and a plurality of resistors and capacitors 130. These components are conductively attached to lead locations remote from the periphery, preferably by soldering, so that the flat ends 102 of the respective leads can provide the connections to external parts. By virtue of their attachment to the leads, the components bridge the gaps 104 between adjacent leads and thus act mechanically stabilizing and strengthening.

System 100 of FIG. 1 further includes packaging compound 140, which encapsulates surface 101a of the leadframe together with the components assembled on the leadframe. For clarity purpose, compound 140 is depicted transparent in FIG. 1; in actual systems 100, however, compound 140 is preferably an epoxy-based molding material and thus not permeable to visible light. As an example, the thickness 141 of compound 140 may be in the range from about 1.8 to 2.0 mm.

Figure 2:
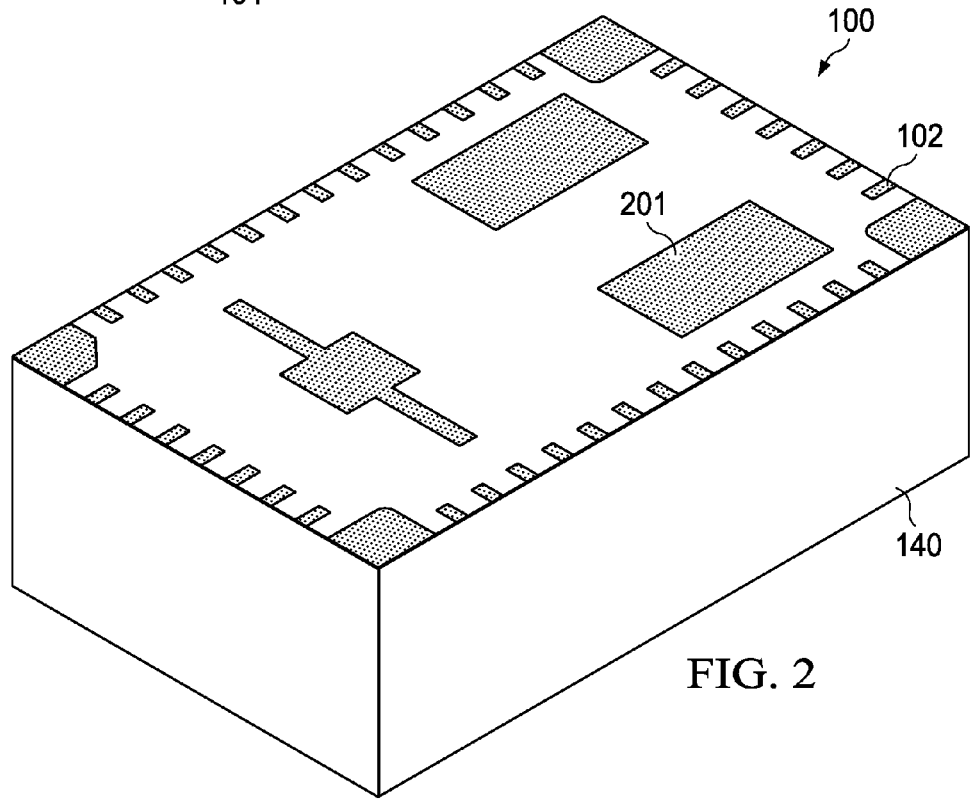
FIG. 2 illustrates schematically a perspective bottom view of the packaged electronic system of FIG. 1; the package material leaves un-encapsulated exclusively the surfaces of the lead portions intended for soldering to external parts; there are no other exposed metal surfaces.

FIG. 2 displays a bottom view of the exemplary packaged electronic system 100. The packaging compound encapsulating the electronic system is designated 140. FIG. 2 shows that compound 140 leaves un-encapsulated exclusively the peripheral flat metal pads of lead ends 102, which are exposed for soldering, and further the larger sections 201 intended for external soldering and heat removal. Other than these metal surfaces intended for external soldering, there are no further metal surfaces exposed on the bottom of packaged system 100.

Figure 3:
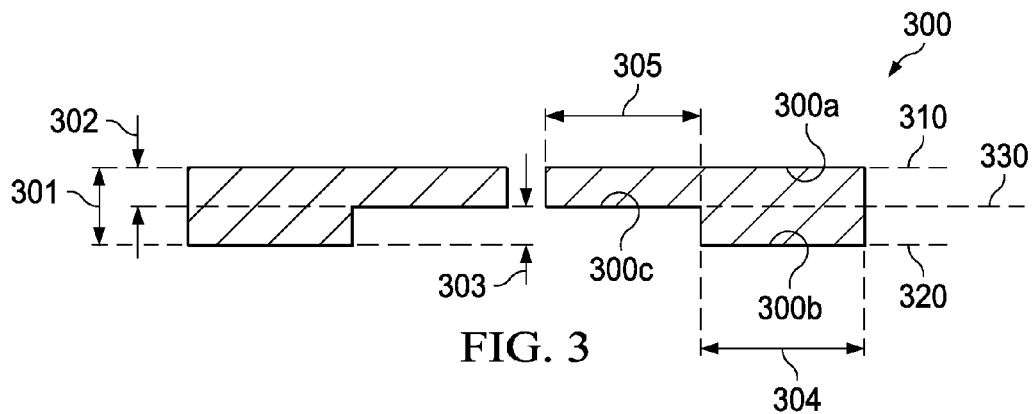
FIG. 3 is a schematic cross section of a leadframe with lead portions of a first and a diminished second thickness.

FIG. 3 depicts a schematic cross section of the leadframe, generally designated 300, to illustrate its structural elements. Preferably, the features of the leadframe are etched (alternatively, stamped) from a single piece of metal sheet, preferably copper or copper alloy, with a starting thickness 301, preferably in the range from about 120 to 250 μm; thinner or thicker metal sheets may be used. Alternatively, the leadframe metal may be aluminum or aluminum alloy, an iron-nickel alloy, or Kovar™. After the features including the lead contours are formed, portions of the leadframe, especially portions of the leads, are further etched to reduce the thickness about 50% from its original value 301 to a diminished value 302, while other portions (the peripheral lead ends and the soldering pads) maintain the original thickness 301. A leadframe including two distinct lead thicknesses is often referred to as a half-etched leadframe.

Determined by the starting sheet, the top surface 300a of the leads are in a first plane 310, and the lead portions of the bottom surface 300b are in a parallel second plane 320. The distance between the top surface 300a and the bottom surface 300b is the original sheet thickness 301. The surfaces 300c of the lead portions of reduced thickness 302 are in a parallel third plane 330. A comparison with FIG. 2 shows that the lead portions with the first thickness 301 are at the peripheral lead ends and in the lead sections intended for external soldering; the surface 300b of these lead portions are exposed (uncovered by the package compound). The balance of the leads has the reduced second thickness 302; these lead portions include the elongated sections of the leads and are covered by the package compound.

The difference between the first lead thickness 301 and the reduced second lead thickness 302 is a step in the metal of the leads, designated 303 in FIG. 3. After forming, the leads exhibit geometries including end portions of length 304, width (not shown in FIG. 3), and step 303. From step 303 to the tip of the lead, the length of reduced metal thickness is 305. For an actual leadframe, the positions of steps 303 of the respective leads, and thus the ratio of the lead lengths of second thickness relative to first thickness is illustrated by the bottom view of an exemplary QFN/SON leadframe 101 in FIG. 4.

Figure 4:
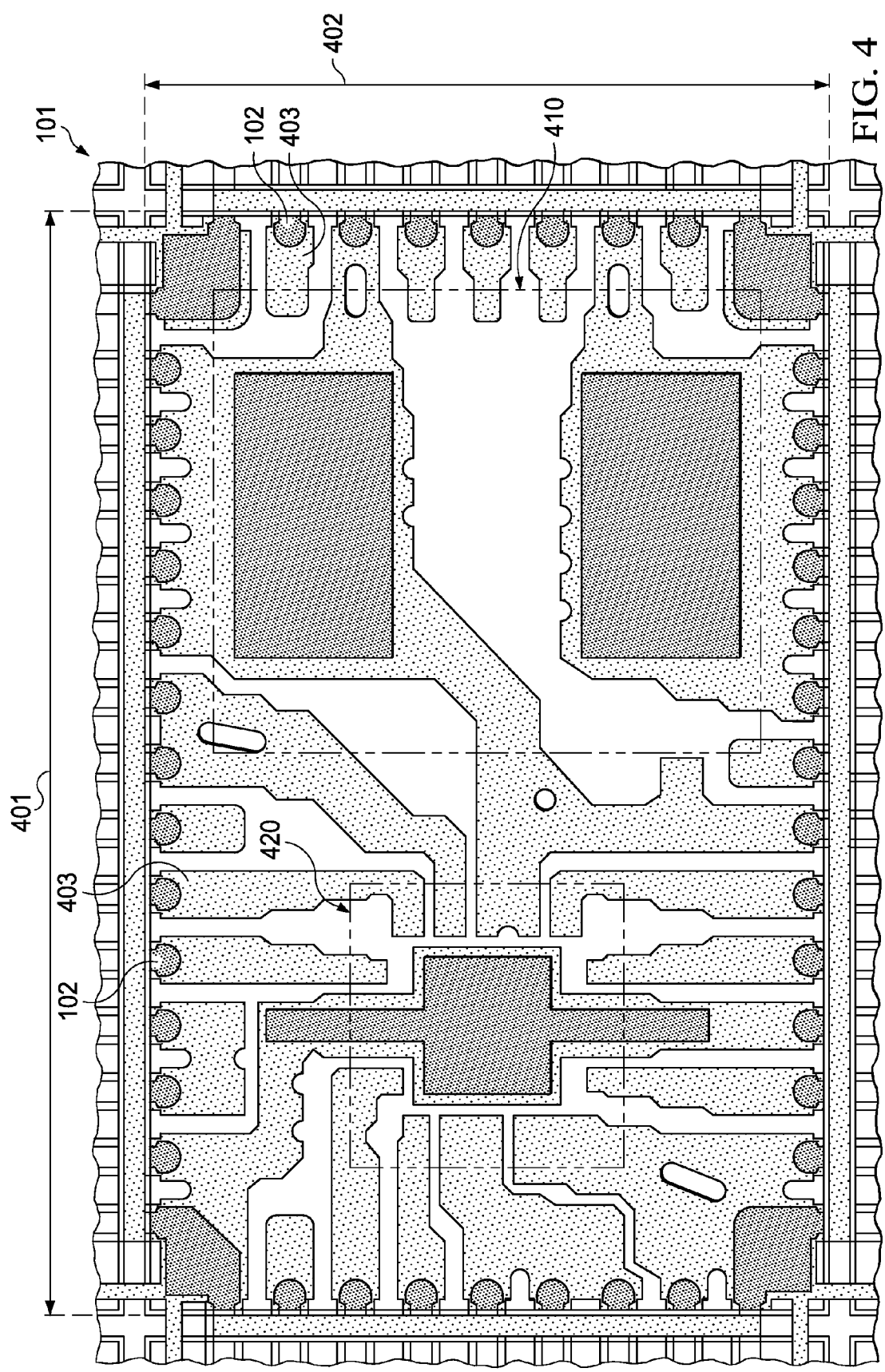
FIG. 4 depicts a bottom view of a complete QFN/SON-type leadframe according to the invention, with elongated leads from the periphery towards the center region. The lead portions of the first thickness are dark shaded and the lead portions of the diminished second thickness are light shaded.

The leads of the exemplary leadframe are formed by stamping or etching from a starting sheet of copper in the thickness range from 120 to 250 μm. Without the rails, the length 401 of the leadframe is about 15 mm, and the width 402 about 9 mm. In FIG. 4, the leadframe portions with the original first metal thickness 301 (120 to 250 μm) are dark shaded; the portions with about 50% reduced thickness 302 (about 60 to 120 μm, produced by additional etching) are light shaded. The lead ends 102, shaped as flat pads, are arrayed along the periphery of leadframe 101. The leads ends have a pitch center-to-center of about 0.9 mm; adjacent leads are spaced apart by gaps about 0.4 mm wide.

Most leads have an elongated shape such as the lead designated 403 in FIG. 4; they extend from the periphery towards the center region of the leadframe. Consequently, such lead will behave like a cantilever: its thick end 102 is anchored, for example by soldering to an external part, while the beam of reduced thickness projects from the support. A force, applied to the thinner end of the projecting cantilever, will bend the cantilever. As FIG. 4 shows, for many leads 403 the length of the leads is much greater than the size of the fixture so that the cantilever is large and thus sensitive to even small forces. As stated, the cantilevers metal also has reduced thickness. The sensitivity of the cantilevers is a roadblock, when components, such as indicated by dashed outlines 410 and 420, have to be affixed to leads 403 on the surface opposite to the one displayed in FIG. 4. It is a problem that for the component assembly by soldering, the forces involved cannot be applied to leads which are unsupported. The problem is solved by the inventive temporary auxiliary apparatus discussed below.

In the preferred embodiment of leadframe 101, the surfaces of the leads are prepared for optimizing the success of subsequent process steps. The dark-shaded lead surfaces in FIG. 4 (designated 300b in FIG. 3) preferably receive a selective metallurgical configuration to enhance the solderability to external parts. For example, the dark-shaded lead surfaces may receive a layer of nickel on the copper surface, followed by thin layer of palladium on the nickel, followed by a very thin layer of gold on the palladium. Alternatively, the dark-shaded lead surfaces may receive a layer of tin or a tin alloy. The light-shaded lead surfaces in FIG. 4 (designated 300c in FIG. 3) may receive a roughening treatment (for instance by plasma bombardment or by chemical etching) in order to enhance adhesion of copper to polymeric molding compounds.

Figure 5:
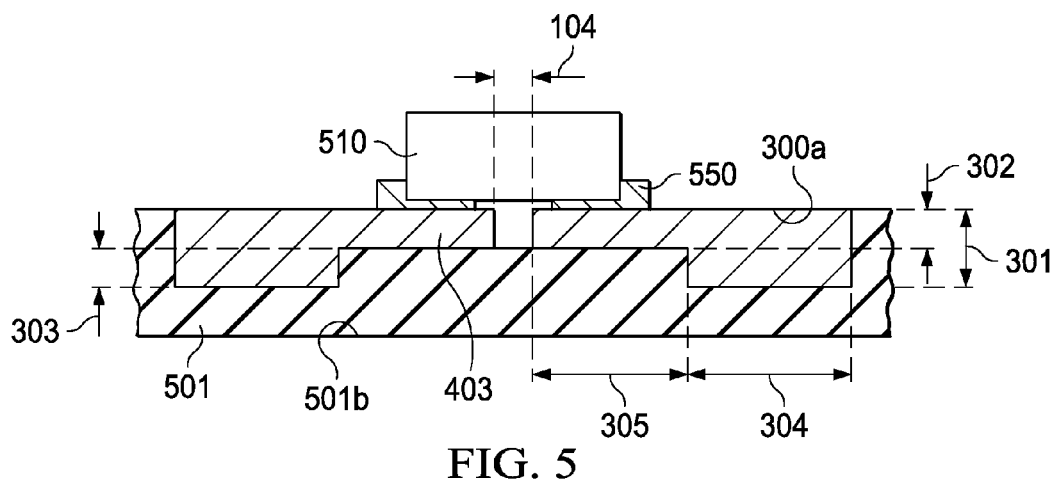
FIG. 5 is a schematic cross section of a pallet for temporarily supporting the leadframe during the assembly step of the system components onto the leadframe. According to the invention, the pallet has surface indents of a depth equal to the difference between the first and the diminished second lead thickness.

FIG. 5 illustrates the inventive temporary auxiliary apparatus 501 employed during the process steps of assembling electronic components 510 to the surface 300a of the elongated leads. The preferred assembly method uses solder 550. Apparatus 501 is a carrier or platform referred to as a pallet; it is preferably made of an insulating inert material such as Teflon or a low-cost plastic or fiberglass-enforced material, which can sustain the elevated temperatures needed for reflowing solder and screen print paste 550. Alternatively, it may be made of metal such as stainless steel or oxidized aluminum. Pallet 501 may be designed to support one leadframe unit or a strip including a plurality of leadframe units (which is the preferred way for batch assembly). Preferably, pallet 501 is re-usable for numerous assembly runs.

As FIG. 5 shows, pallet 501 has a flat bottom 501b and is machined to offer surface indents matching the leadframe contours. In particular, the indents have depths equal to the first lead thickness 301, the second lead thickness 302, and the step 303, which is equal to, or greater than, the difference between the first and second lead thicknesses. The indents are machined with enough tolerance so that the leadframe can be placed in the pallet without bending or jamming the leadframe features.

In the process flow of assembling, the pallet is provided and loaded with the leadframe by aligning the leads with the pallet indents and placing the leadframe, or strip, into the pallet. In the preferred next process step, solder paste 550 is supplied to selected locations of the elongated leads of reduced second thickness. Electronic components 510 including inductors, resistor, capacitors, and packaged devices are then attached to the respective locations so that they bridge the gaps 104 between adjacent leads. Thereafter, the solder is reflowed, cooled, and cleaned. By bridging the gaps 104 between adjacent leads, the components lend strength and stability to the cantilever leads.

Figure 6:
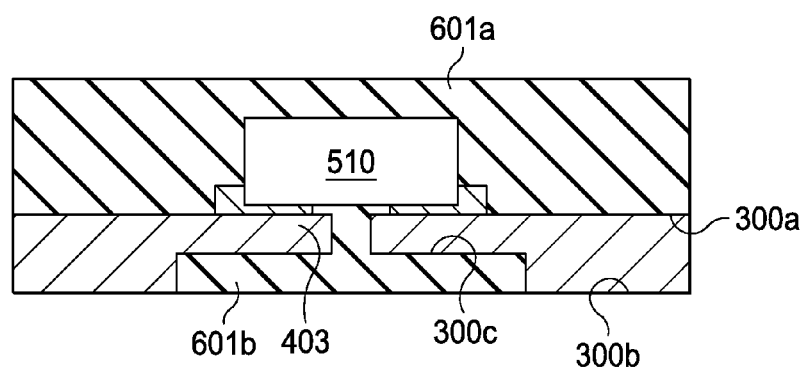
FIG. 6 depicts a schematic cross section of a packaged electronic system, after the steps of completing the assembly of the components onto the leadframe, removing the supportive pallet, and packaging the assembled system in an encapsulating material.

Next, the leadframe, or leadframe strip, with the assembled components is lifted from the pallet, which can be re-used. As indicated in FIG. 6, the leadframe, or leadframe strip, with the assembled components is proceeding to a station for encapsulation in a packaging compound. Preferably, the encapsulation method is the well-controlled molding technology using an epoxy-based compound. As FIG. 6 shows, the encapsulation compound covers the first leadframe surface 300a with the assembled components 510 (this compound portion is designated 601a) and the surface 300c of the lead portions of reduced thickness (this compound portion is designated 601b). FIG. 6 further shows that the encapsulation compound fills the gaps (designated 104 in FIG. 5) between adjacent leads. On the other hand, the compound leaves un-encapsulated exclusively the surface 300b of the peripheral lead ends 102 and the leadframe sections 201 (not shown in FIG. 6, but illustrated in FIG. 2). As stated above, these exposed metals have solderable surfaces and connect the assembled system to external parts.

The compound portion 601b takes over permanently the function of supporting the cantilever-shaped leads 403, which had been temporarily supported by the pallet during the assembly operation. Furthermore, compound portion 601b covers cantilevers 403 fully so that they are sealed from environmental influences such as moisture.

If the encapsulation process involved a whole leadframe strip, the final process step includes the singulation of the packaged leadframe strip into discrete units by trimming away the metal frame and cutting the encapsulation compound and the strip, preferably by sawing.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to any number of components assembled on the leadframe, with any combination of large-size and small-size components.

As another example, the method can be extended to any application, where a cantilever sensitive to bending needs temporary support in an operation, which uses a high enough force on the cantilever to cause bending or deformation without support. Examples can be found among MEMS, devices with membranes or oscillators, and gyroscopes.

It is therefore intended that the appended claims encompass any such modifications or embodiments.

We claim:

1. A packaged electronic system comprising:
a QFN/SON-type leadframe having elongated leads from the periphery towards the center region, the leads having a first thickness at the peripheral ends as well as in sections for external soldering, and a diminished second thickness throughout the elongated lead portions, wherein the second thickness is about one half of the first thickness;
electronic components attached to the leads in the second thickness portions, the components bridging gaps between adjacent elongated leads; and
packaging compound encapsulating the leadframe with the components, leaving un-encapsulated exclusively the peripheral lead ends and the sections for external soldering.

2. The system of claim 1 wherein the top surfaces of the leads are in a first plane, the peripheral lead ends and the soldering pads in a parallel second plane, and the lead portions of reduced thickness in a parallel third plane.

3. The system of claim 2 wherein the leadframe includes copper.

4. The system of claim 3 wherein the lead surfaces in the first and third planes have an affinity for adhering to polymeric compounds, and the lead surfaces in the second plane are solderable.

5. The system of claim 4 wherein the lead surfaces in the first and third planes have been roughened.

6. The system of claim 4 wherein the lead surfaces in the second plane have a metallurgical finish including a layer of nickel on the copper, a layer of palladium on the nickel, and an outermost layer of gold on the palladium.

7. The system of claim 1 wherein the electronic components are selected from a group including Power ICs, capacitors, inductors, and resistors.

8. A method for fabricating an electronic system including the steps of:
providing a strip of leadframes for QFN/SON-type devices, each leadframe including elongated leads from the periphery towards the center region, the leads having a first thickness at the peripheral ends and in sections intended for soldering, and a diminished second thickness throughout the elongated lead portions;
providing a pallet for supporting the leadframe strip, the pallet having surface indents of depths equal to the first and second lead thicknesses with a step equal to, or greater than, the difference between the first and second lead thicknesses;
supporting the leads by aligning the leads with the pallet indents and placing the strip onto the pallet; and
attaching electronic components to respective leadframe sites having the second thickness, thereby bridging gaps between adjacent leads and stabilizing the elongated leads.

9. The method of claim 8 further including the steps of:
lifting the leadframe strip with the assembled components from the pallet;
encapsulating the leadframe strip with the components in a packaging compound, including the gaps between the leads, leaving un-encapsulated exclusively the peripheral lead ends and the sections intended for soldering; and
singulating the packaged leadframe strip into discrete units by trimming the frame and cutting the strip.

* * * * *